(12) United States Patent
Choi

(10) Patent No.: US 8,548,015 B2
(45) Date of Patent: Oct. 1, 2013

(54) WAVELENGTH-TUNABLE EXTERNAL CAVITY LASER MODULE

(75) Inventor: Byung-seok Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/978,957

(22) Filed: Dec. 27, 2010

(65) Prior Publication Data

US 2012/0014398 A1 Jan. 19, 2012

(30) Foreign Application Priority Data

Jul. 16, 2010 (KR) .................. 10-2010-0069118

(51) Int. Cl.
  *H01S 3/10* (2006.01)
(52) U.S. Cl.
  USPC .................. 372/20; 372/26; 372/34; 372/102
(58) Field of Classification Search
  USPC .......................................................... 372/20
  See application file for complete search history.

(56) References Cited

U.S. PATENT DOCUMENTS

| | | | | |
|---|---|---|---|---|
| 5,982,793 | A * | 11/1999 | Kobayashi et al. | 372/38.1 |
| 7,573,919 | B2 | 8/2009 | Cattelan et al. | |
| 2004/0105480 | A1 * | 6/2004 | Sidorin et al. | 372/97 |
| 2004/0218642 | A1 * | 11/2004 | Kawanishi | 372/28 |
| 2006/0007971 | A1 * | 1/2006 | Sato et al. | 372/38.02 |
| 2007/0071054 | A1 * | 3/2007 | Takahashi | 372/50.1 |
| 2009/0086508 | A1 * | 4/2009 | Bierhuizen | 362/617 |

FOREIGN PATENT DOCUMENTS

| | | |
|---|---|---|
| CN | 101601176 A | 12/2009 |
| JP | 2010-512016 T | 4/2010 |
| KR | 2000-0018925 A | 4/2000 |
| KR | 2008-0052319 A | 6/2008 |
| KR | 2009-0011837 A | 2/2009 |
| KR | 2009-0106382 A | 10/2009 |

OTHER PUBLICATIONS

Jie Hyun Lee et al., "Tunable External Cavity Laser Based on Polymer Waveguide Platform for WDM Access Network", IEEE Photonics Technology Letters, 2005, vol. 17, No. 9, pp. 1956-1958, Sep. 2005.
Su Hwan Oh et al., "Tunable external cavity laser employing uncooled superluminescent diode", Optics Express, 2009, vol. 17, No. 12, pp. 10189-10194.
Min-Cheol Oh et al., "Tunable wavelength filters with Bragg gratings in polymer waveguides", Applied Physics Letters, 1998, vol. 73, No. 18, pp. 2543-2545.

* cited by examiner

*Primary Examiner* — Xinning Niu
(74) *Attorney, Agent, or Firm* — Rabin & Berdo, P.C.

(57) ABSTRACT

Provided is a wavelength-tunable external cavity laser module. The wavelength-tunable external cavity laser module includes: a gain medium generating light; an optical waveguide combined with the gain medium and including a Bragg grating and a thin film heater adjusting a temperature of the Bragg grating; and a high frequency transmission medium delivering a high frequency signal to the gain medium, wherein the high frequency transmission medium controls an operating speed of the light.

16 Claims, 23 Drawing Sheets

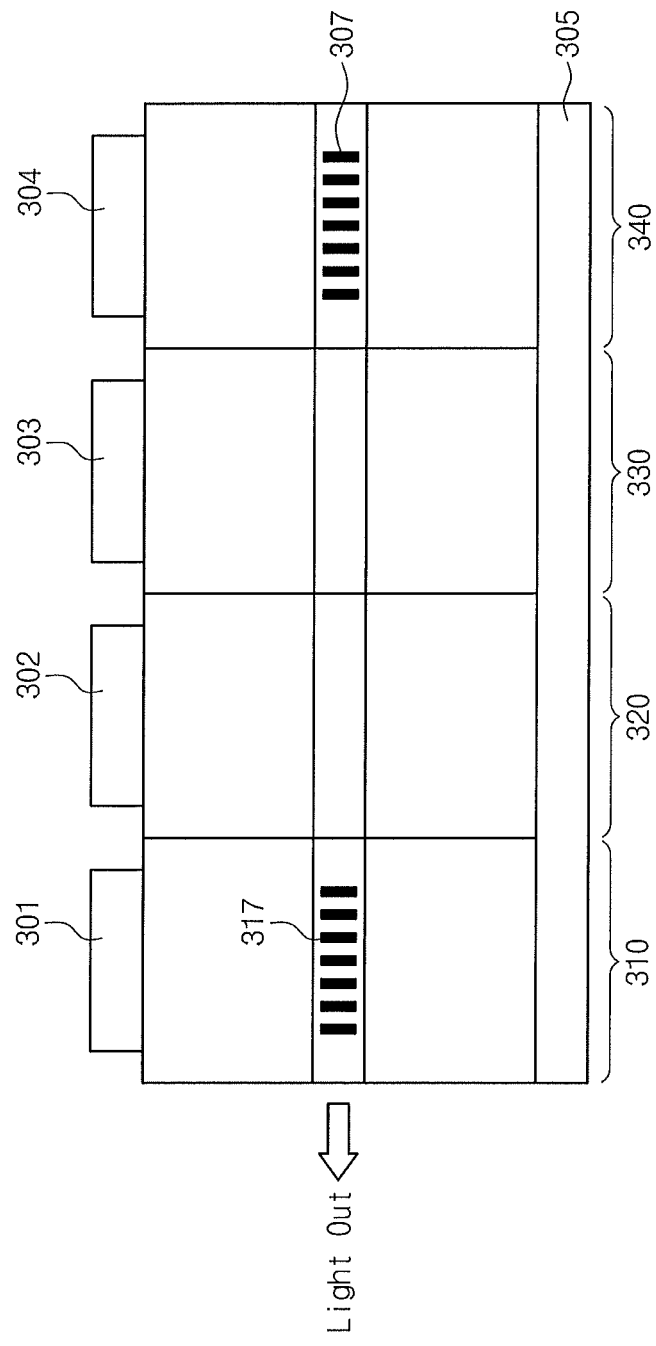

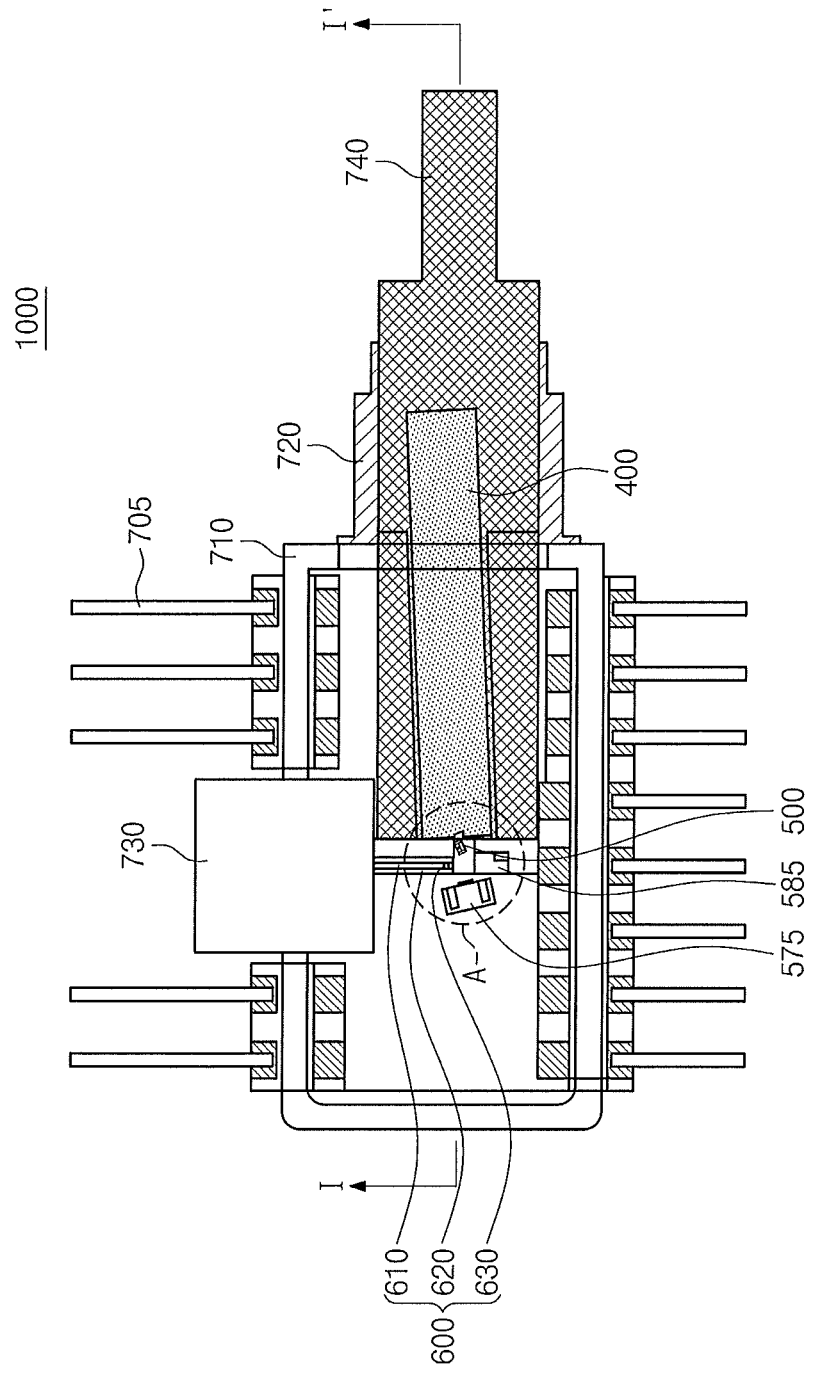

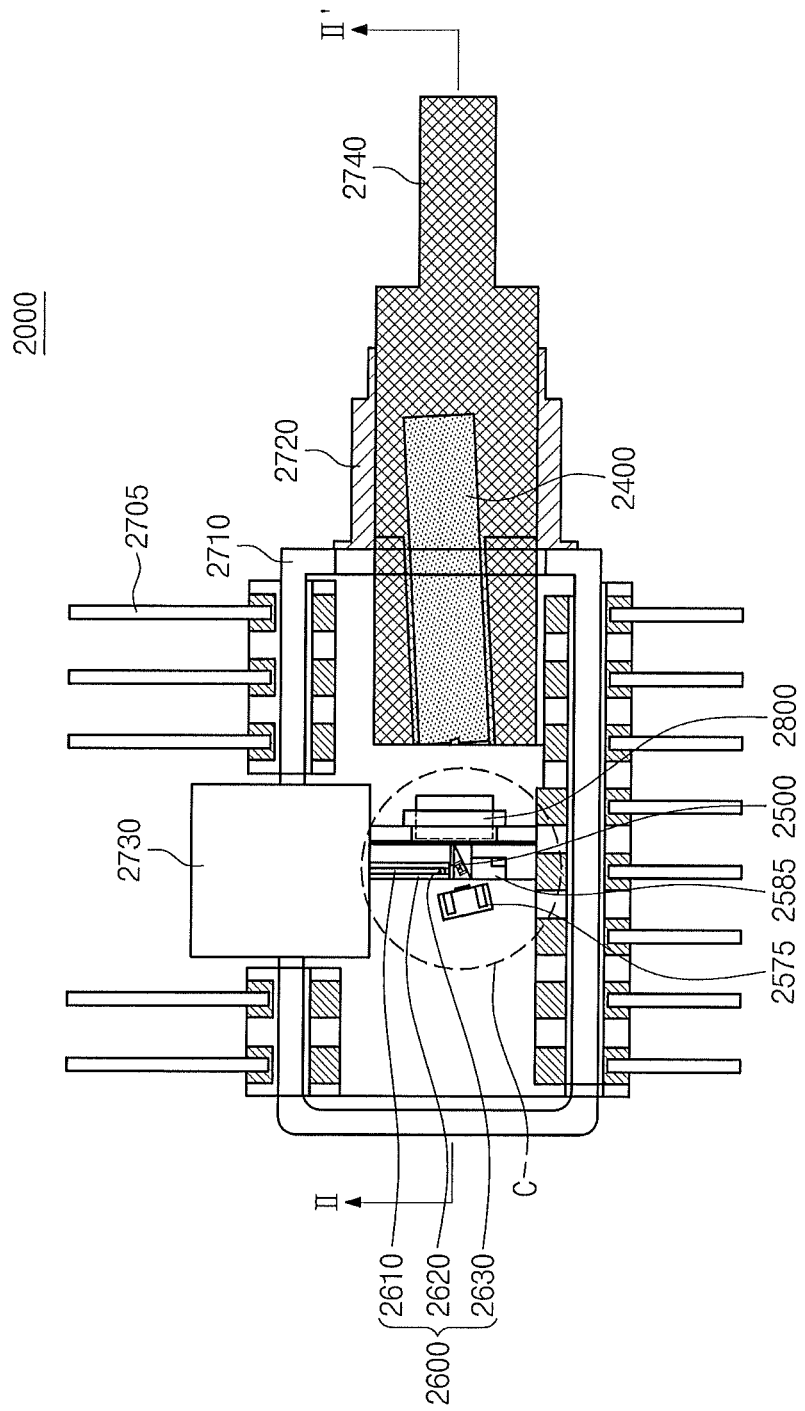

WAVELENGTH-TUNABLE EXTERNAL CAVITY LASER MODULE

CROSS-REFERENCE TO RELATED APPLICATIONS

This U.S. non-provisional patent application claims priority under 35 U.S.C. §119 of Korean Patent Application No. 10-2010-0069118, filed on Jul. 16, 2010, the entire contents of which are hereby incorporated by reference.

BACKGROUND OF THE INVENTION

The present invention disclosed herein relates to an external cavity laser (ECL) module, and more particularly, to a wavelength-tunable external cavity laser module.

Researches for a wavelength division multiplexing (WDM) based passive optical network (PON) have been actively in progress. Hereinafter, the WDM based PON will be referred to as a WDM-PON. The WDM-PON may provide voice, data, and broadcasting convergence services.

In the WDM-PON, communications between a center office (CO) and a subscriber are provided using a wavelength designated for each subscriber. Since a dedicated wavelength for each subscriber is used, security is excellent and communication services of a large volume are possible. In addition, other transmission technologies in which a link rate and a frame format are different in each subscriber or service may be applied to the WDM-PON.

However, since the WDM is a technology for multiplexing a variety of wavelengths in a single optical fiber, respectively different light sources as many as the number of subscribers belonging to one remote node (RN) are required. This becomes a great obstacle because production, installation, and management of a light source for each wavelength may burden users and service provides in terms of an economic aspect. To resolve the above limitations, an application method of a wavelength-tunable light source device for selectively tuning wavelengths of a light source is being actively researched.

SUMMARY OF THE INVENTION

The present invention provides a wavelength-tunable external cavity laser module with an improved operating characteristic.

Embodiments of the present invention provide wavelength-tunable external cavity laser modules including: a gain medium generating light; an optical waveguide combined with the gain medium and including a Bragg grating and a thin film heater adjusting a temperature of the Bragg grating; and a high frequency transmission medium delivering a high frequency signal to the gain medium, wherein the high frequency transmission medium transmits the signal to ECL.

In some embodiments, the high frequency signal may adjust an optical power of the light.

In other embodiments, the high frequency signal may be modulated into a digital signal defined by the optical power.

In still other embodiments, the high frequency transmission medium may include a submount including a ceramic dielectric and a metal thin line on the ceramic dielectric.

In even other embodiments, the high frequency transmission medium may include a printed circuit board (PCB).

In yet other embodiments, the high frequency transmission medium may further include a matching resistance unit disposed between a transmission line and the gain medium.

In further embodiments, the gain medium may include a semiconductor optical amplifier or a laser diode.

In still further embodiments, the gain medium and the optical waveguide may be directly coupled with each other without any optical coupling medium.

In even further embodiments, the wavelength-tunable external cavity laser modules may further include a lens disposed between the gain medium and the optical waveguide, wherein the lens delivers the light between the gain medium and the optical waveguide.

In yet further embodiments, the optical waveguide may further include: a cladding layer on a substrate; and a core layer having at least a portion covered by the cladding layer, wherein the Bragg grating is formed on the core layer or the cladding layer; and the thin film heater is disposed on the cladding layer.

In yet further embodiments, the optical waveguide may further include a phase control unit disposed on the cladding layer.

In yet further embodiments, the optical waveguide may further include a anti-reflection (AR) layer disposed on an incident plane.

In yet further embodiments, an incident plane of the optical waveguide may be slant with respect to a vertical plane in a progressing direction of the light.

In yet further embodiments, the core layer and the cladding layer may include polymer.

In yet further embodiments, the core layer and the cladding layer may include silica.

In yet further embodiments, the wavelength-tunable external cavity laser modules may further include a first thermoelectric cooler disposed at the bottom of the optical waveguide.

In yet further embodiments, the wavelength-tunable external cavity laser modules may further include: a second thermoelectric cooler adjusting a temperature of the gain medium; and a thermistor measuring a temperature of the gain medium.

In yet further embodiments, the wavelength-tunable external cavity laser modules may further include an optical detector to monitor the light.

In yet further embodiments, the wavelength-tunable external cavity laser modules may further include a package in which the gain medium, the optical waveguide, and the high frequency transmission medium are mounted.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 2A and 2B are conceptual diagrams illustrating various wavelength-tunable light sources;

FIG. 9A is a top plan view illustrating a wavelength-tunable external cavity laser module according to another embodiment of the present invention;

DETAILED DESCRIPTION OF PREFERRED EMBODIMENTS

Figure 1A:
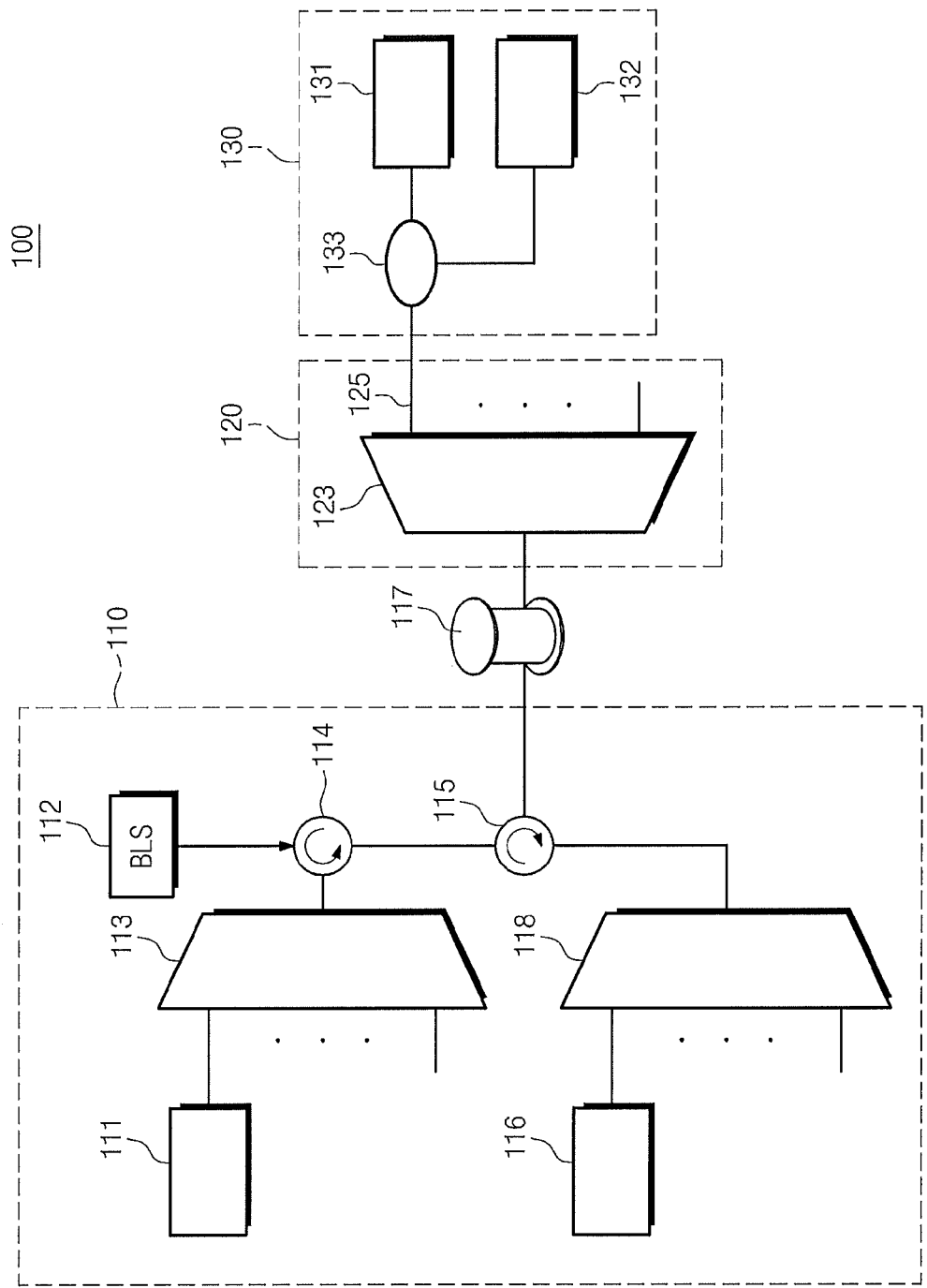
FIG. 1A is a conceptual diagram illustrating a system that uses one broadband light source in typical wavelength division multiplexing (WDM)-passive optical networks (PONs)

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be construed as limited to the scope of the present invention.

The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

FIG. 1A is a conceptual diagram illustrating a system that uses one broadband light source in typical wavelength division multiplexing (WDM)-passive optical networks (PONs).

Referring to FIG. 1A, the WDM-PON system 100 largely includes an optical line terminal (OLT) at a central office, an optical network unit or terminal (ONU/ONT) at a subscriber, and a remote node (RN) 120. A feeder of a single feeder optical fiber 117 is used for connection between the OLT 110 and the RN 120 and a distribution optical fiber 125 is used for connection between the RN 120 and the ONU/ONT 130.

A downward light is delivered from a broadband light source (BLS) in the OLT 110 to an arrayed waveguide grating (AWG) 123 of the RN 120 through a first optical circulator 114, an AWG 113 of a WDM multiplexing and de-multiplexing function, a reflective semiconductor optical amplifier (RSOA) 111 for the OLT, a second optical circulator 115, and the feeder optical fiber 117, and then is finally delivered to an optical transmitter 131 and an optical receiver 132 through an 1×2 optical coupler 133 or an optical circulator in the ONU/ONT 130, using the distribution optical fiber 125.

An upward light is delivered in an opposite direction of the downward light. That is, the upward light is delivered from the optical transmitter 131 for the ONU to the optical receiver 116 for the OLT through the 1×2 optical coupler 133, the distribution optical fiber 125, the AWG 123 of the RN 120, the feeder optical fiber 117, the second optical circulator 115, and the AWG 118.

An advantage of this method is that a colorless system may be provided without obtaining an additional light source at a subscriber terminal because a light source at the OLT is used in the ONU also. However, since a reflective semiconductor optical amplifier is used as an amplification and modulation medium, speed limit exists, so that it is recognized that it is difficult for this method to be used in a 10 Gbps level system.

Figure 1B:
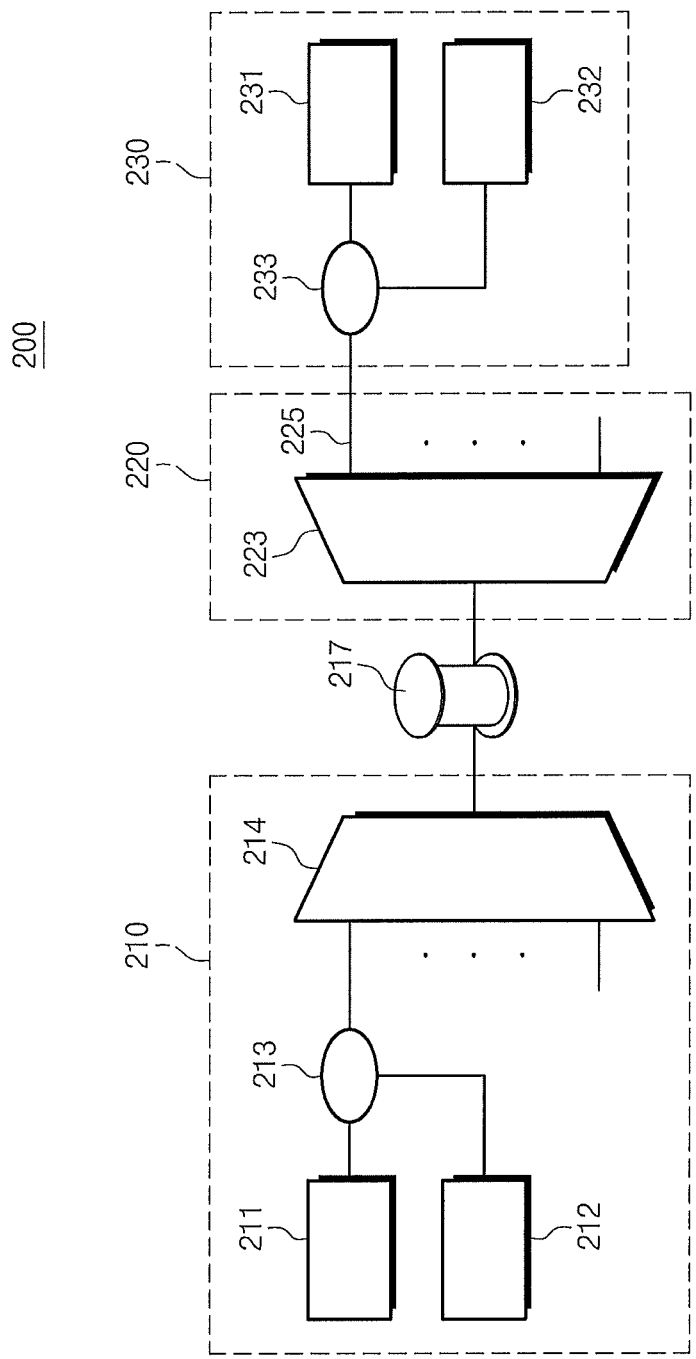
FIG. 1B is a conceptual diagram illustrating a system that uses another wavelength-tunable light source among typical WDM-PONs.

FIG. 1B is a conceptual diagram illustrating a system that uses another wavelength-tunable light source among typical WDM-PONs.

Referring to FIG. 1B, a WDM-PON system 200 includes an OLT 210 at a central office, an ONU/ONT 230 at a subscriber, and an RN 220. A feeder optical fiber of a single core is used for connection between the OLT 210 and the RN 220 and a distribution optical fiber 225 is used for connection between the RN 220 and the ONT/ONT 230.

A downward light is delivered from a wavelength-tunable light source 211 of the OLT 210 to an optical receiver 232 at a subscriber through a WDM filter 213, an AWG 214, a feeder optical fiber 217, an AWG 223, a distribution optical fiber 225, and a WDM filter 233. An upward light progresses in an opposite direction of the downward light and then is delivered to an optical transmitter 212 of the OLT 210.

Unlike FIG. 1A, in order to provide a system with no dependence on a wavelength, the wavelength-tunable light sources 211 and 231 are used for the OLT and the ONU/ONT 230, respectively. Although there is a limitation that a light source needs to be obtained by each of the OLT 210 and the ONU/ONT 230, a high performance may be achieved in terms of an operating speed because it is a system using a laser. The key point is the availability of a reliable and cost-effective tunable light source.

Figure 2B:
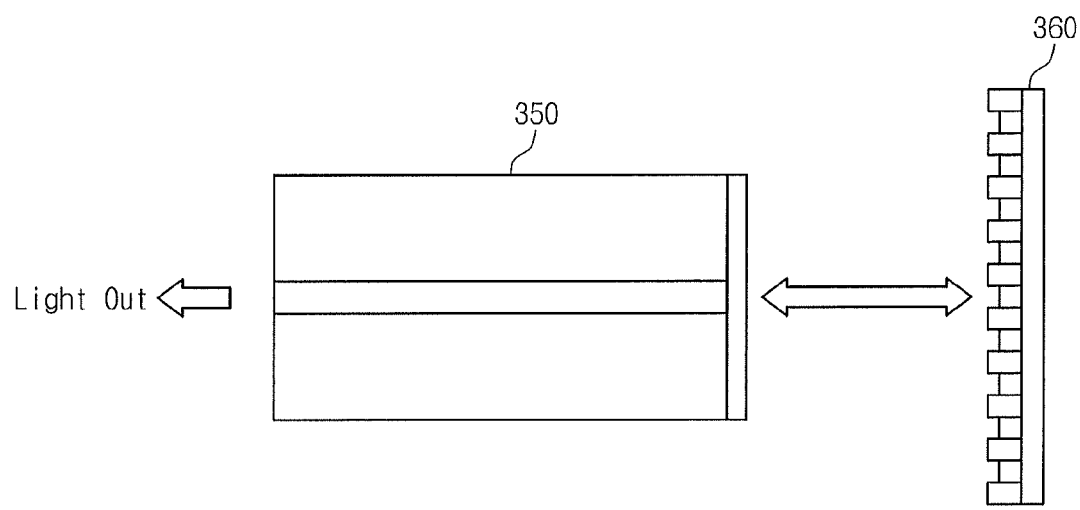

FIGS. 2A and 2B are conceptual diagrams illustrating various wavelength-tunable light sources.

Referring to FIG. 2A, each component of a wavelength-tunable light source is monolithically-integrated. The wavelength-tunable light source includes a first Bragg region 310 having a first Bragg grating 317, a gain medium 320, a phase control region 330, and a second Bragg region 340 having a second Bragg grating 307. A first electrode 305 and a second electrode 302 are electrodes for supplying a gain current. The first electrode 305 and a third electrode 303 are electrodes for supplying a phase control current. The first electrode 305 and a fourth electrode 301 may supply a current for adjusting a Bragg wavelength by changing a refractive index of the first Bragg region 310. The first electrode 305 and a fifth electrode 304 may supply a current for adjusting a Bragg wavelength by changing a refractive index of the second Bragg region 340.

If these components with respectively different functions are integrated into one device, there may be problems during device fabrication. Usually, a mirror surface such as a distributed Bragg reflector (DBR) is disposed at the front and rear positions of the gain medium 320 and the phase control region 330 is integrated thereto. In addition, if power amplification is needed, an optical amplifier is integrated at the output facet. Since each functional unit has a medium of a different composition, various issues such as internal reflection and absorption at the interface therebetween may easily occur due to growing and etching processes of a material. Moreover, in order to search the proper wavelength, measurement automation which separately control each component of single device with all current combinations possible is required, and thus, considerable time is consumed. Due to this, complexity of a control unit is inevitable after a module is fabricated.

FIG. 2B is a view illustrating a hybrid structure in which a laser is produced by packaging a gain medium 350 and an external Bragg grating 360. After Each component is manufactured separately, an external cavity laser is formed by packaging the gain medium 350 and the external Bragg grating 360 for controlling a wavelength into single device. The technical maturity of each component enable the yield to be improved. Also, a typical optical device packaging method may be used for manufacturing the external cavity laser. The external Bragg grating 360 may be manufactured using a material like compound semiconductor, silica or polymer.

Figure 3B:
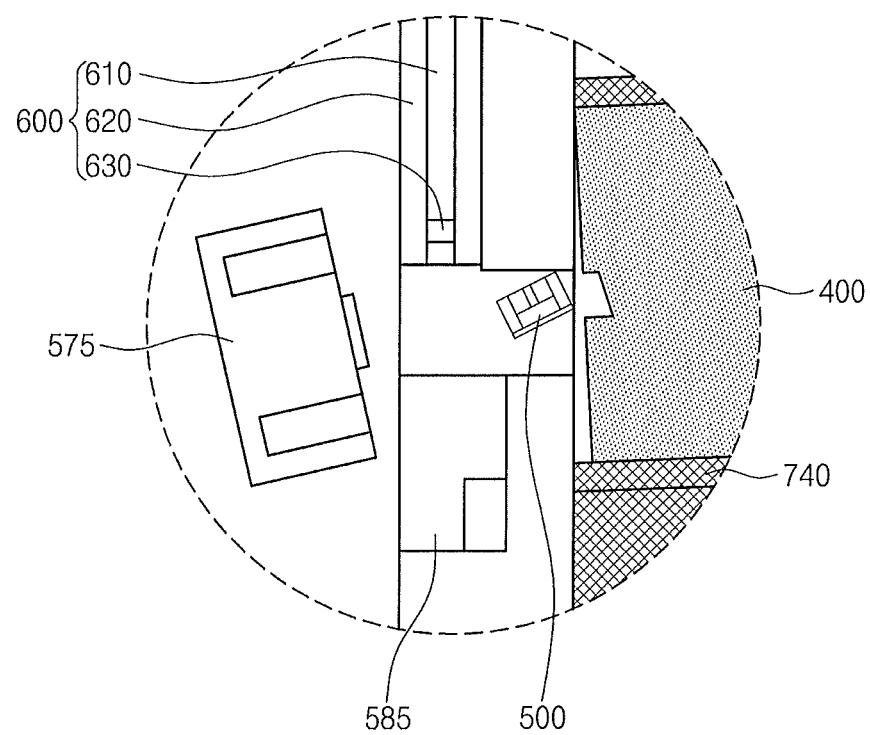
FIGS. 3A through 4C are views illustrating a wavelength-tunable external cavity laser module according to an embodiment of the present invention.
Figure 4A:
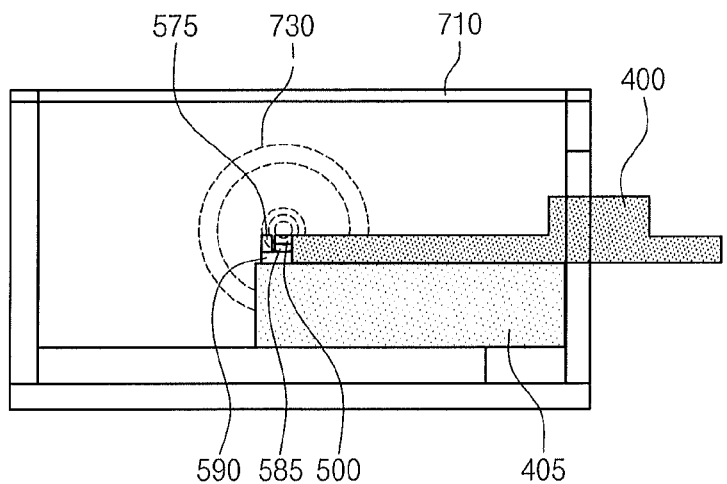
Figure 4B:
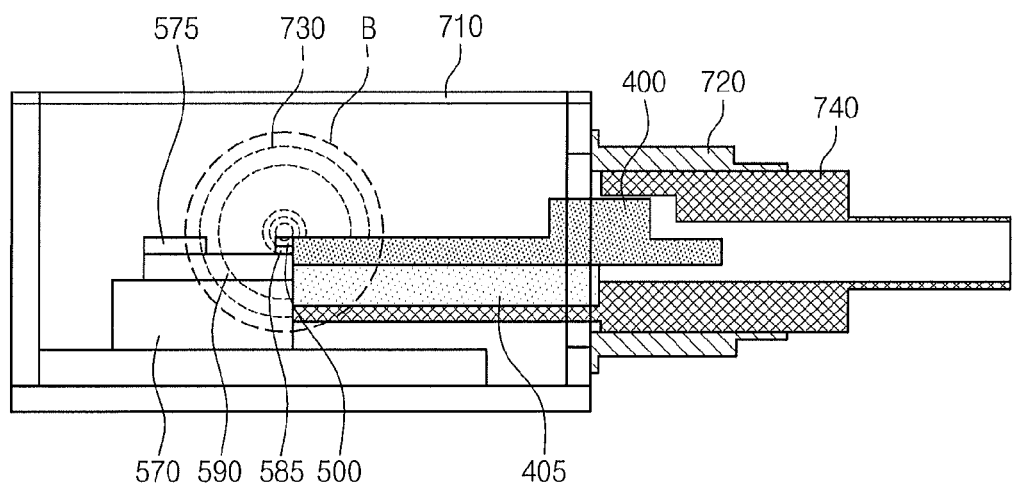
Figure 4C:
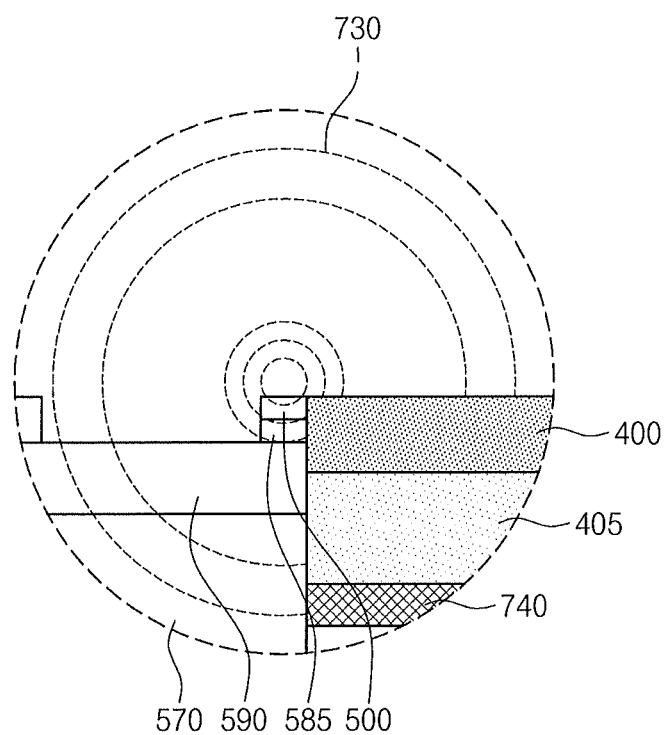

FIGS. 3A through 4C are views illustrating a wavelength-tunable external cavity laser module according to an embodiment of the present invention. FIG. 3A is a top view of the wavelength-tunable external cavity laser module. FIG. 3B illustrates an enlarged portion A of FIG. 3A. FIG. 4B is a sectional view taken along the line I-I' of FIG. 3A. FIG. 4C illustrates an enlarged portion B of FIG. 4B.

Referring to FIGS. 3A through 4C, a wavelength-tunable external cavity laser module 1000 includes a gain medium 500 for generating and amplifying light, an optical waveguide 400 for forming a mirror surface being combined with the gain medium 500, and a high frequency transmission medium 600 for delivering a high frequency signal to the gain medium 500. The high frequency transmission medium 600 may control an operating speed of the generated light. In more detail, once a bias current is applied to the gain medium 500, light is generated and amplified and when the bias current is more than a critical value, lasing occurs between the mirror surfaces formed by a high reflection (HR) layer on the gain medium 500 and the optical waveguide 400. A high frequency signal delivered by the high frequency transmission medium 600 is added to the bias current, such that a size of optical power generated in laser may be adjusted. An output power of the light may be modulated by a frequency of the high frequency signal. Modulation speed of an optical signal may be understood as the degree (i.e., bit per second) that a digital signal or an analog signal repeats.

The high frequency electrical signal through transmission medium 600 may not be distorted in order to modulated the external cavity laser properly. In addition, the high frequency signal may be modulated into a digital signal defined by the optical power. In more detail, when a current or voltage value of a high frequency signal delivered by the high frequency transmission medium 600 is controlled, optical output power may be modulated into a digital signal in which a relatively high optical power is defined as 1 and a relatively low optical power is defined as 0. This digital signal may have a bit rate of more than about 10 Giga bit per second (Gbps).

The high frequency transmission medium 600 may be a printed circuit board (PCB) or a submount. The PCB or submount may include a conductive metal thin line 610, a dielectric 620, and a matching resistance unit 630. If the high frequency transmission medium 600 is the PCB, the dielectric 620 may include an epoxy resin or a phenolic resin. If the high frequency transmission medium 600 is the submount, the dielectric 620 may include a ceramic dielectric. The matching resistance unit 630, being added with a resistance value of the gain medium 500, may function to adjust total impedance of signal transmission point, such that signal transmission to the device is maximized. The matching resistance unit 630 adjusts a total impedance including the gain medium 500 to be about 25Ω, about 50Ω, or about 75Ω according to an internal impedance of a signal source. The metal thin line 610 on the high frequency transmission medium 600 may include a microstrip line or a coplanar waveguide (CPW) and may be combined with the dielectric 620 to form a transmission line.

The gain medium 500, the optical waveguide 400, and the high frequency transmission medium 600 may be all mounted on a package 710. The package 710 may have a form of a buffer fly, a mini dual in-line (DIL), a mini flat, and a transmitter optical sub-assembly (TOSA). The package 710 may include a lead frame 705 for delivering an external electrical signal. The high frequency transmission medium 600 may transmit a high frequency electrical signal, which is delivered through a high frequency connector 730, to the gain medium 500.

The gain medium 500 and the optical waveguide 400 may generate the laser light through direct optical coupling without usage of lens. By this direct coupling method, in relation to the wavelength-tunable external cavity laser module according to an embodiment of the present invention, the length of a cavity where a laser signal is generated is reduced, such that a bandwidth may be easily secured. That is, when a frequency operating characteristic is measured, a cavity peak occurs, which corresponds to the length of the external cavity. By realizing the cavity peak with a shorter cavity to send it to a higher frequency region, bandwidth reduction effect caused by the cavity peak is reduced such that a high speed operation may be achieved.

The optical waveguide 400 may be directly disposed within the package 710 or may be combined with the package 710 through an additional optical waveguide supporting part 740. When the optical waveguide 400 is disposed within the package 710, a metal support structure for welding 720 and the optical waveguide supporting part 740 may be unnecessary. In this case, one of the gain medium 500 and the optical waveguide 400 may be fixed in advance and then, the other may be optically coupled within a distance range of about 1

µm to about 50 µm through an active or passive alignment method such as flip chip bonding.

The optical waveguide 400 may be combined with an additional optical waveguide supporting part 740. The optical waveguide supporting part 740 and the package 710 may be combined by the metal support structure for welding 720 through an active alignment method.

A first thermoelectric cooler 405 may be disposed at the bottom of the optical waveguide 400. The first thermoelectric cooler 405 may adjust a temperature of the optical waveguide 400 to be a specific temperature. The gain medium 500 may be disposed on the top of the first thermoelectric cooler 405 or an additional second thermoelectric cooler 570. The first thermoelectric cooler 405 or the additional second thermoelectric cooler 570 may adjust a temperature of the gain medium 500 to be a specific temperature. A structure supporting part 590 may be disposed between the first thermoelectric cooler 405 or the additional second thermoelectric cooler 570 and the gain medium 500. The structure supporting part 590 may include a silicon or compound semiconductor substrate engraved with a pattern for a device alignment or a super used stainless steel (SUS) with excellent processability. A thermistoror 585 for measuring a temperature of the gain medium 500 may be disposed on the structure supporting part 590. An optical detector 575 for monitoring an average optical power of the gain medium 500 may be disposed on the structure supporting part 590. The optical detector 575 may include a photo diode.

The metal support structure for welding 720 may form a thermal emission path of the optical waveguide 400 and the thermal emission path may be formed by applying a solder or an epoxy of a silver component to a junction part when a package is assembled.

The optical waveguide 400 may be combined with the additional optical waveguide supporting part 740. The optical waveguide supporting part 740 and the package 710 may be combined by the metal support structure 720 through an active alignment method. The metal support structure 720 may be used to form heat-emission path of the optical waveguide 400. Or, with the package assembled, a heat emission path may be formed applying a solder or an epoxy of a silver component to junction.

Figure 5:
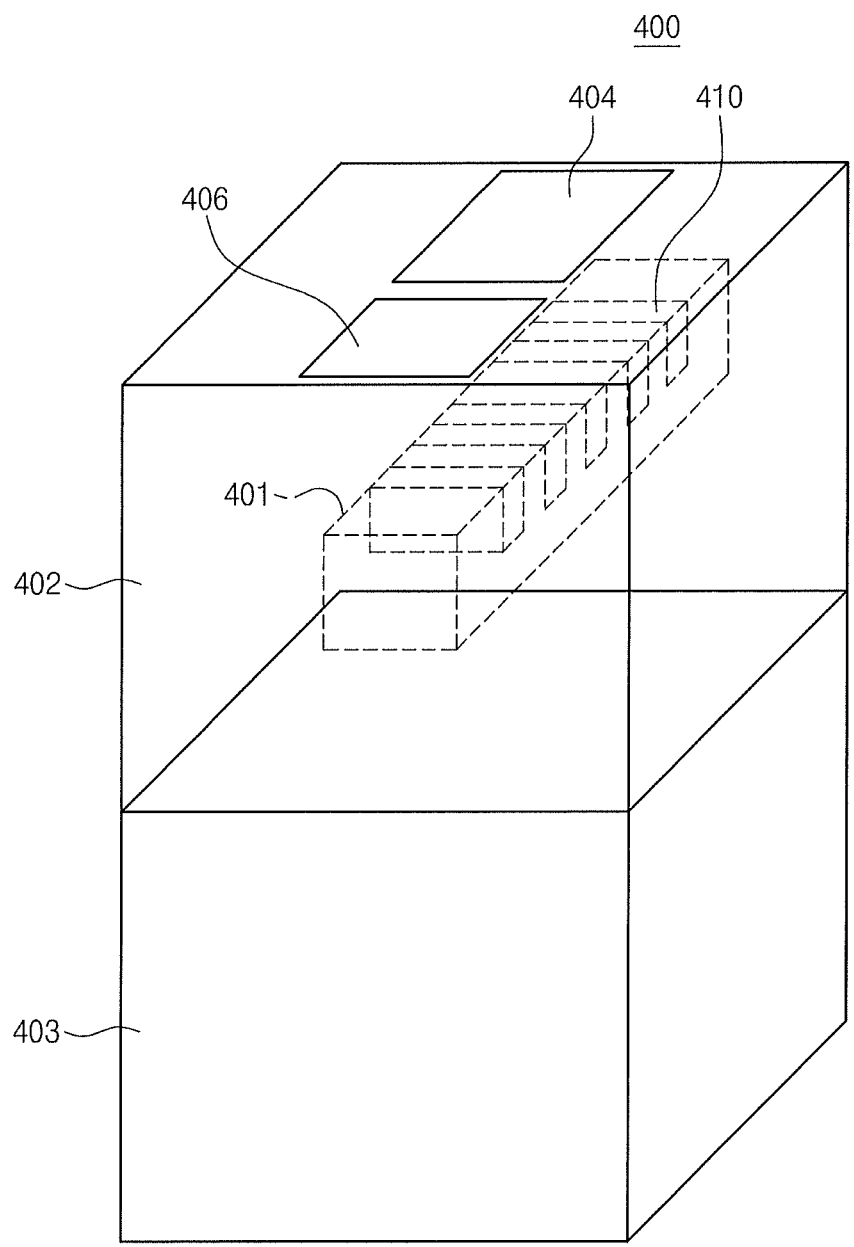
FIG. 5 is a view illustrating a detailed optical waveguide of a wavelength-tunable external cavity laser module according to an embodiment of the present invention.

FIG. 5 is a view illustrating a detailed optical waveguide 400 of a wavelength-tunable external cavity laser module according to an embodiment of the present invention.

Referring to FIG. 5, the optical waveguide 400 may be a planar lightwave circuit (PLC). The optical waveguide 400 includes a core 401 and a cladding layer 402 on a silicon or compound semiconductor substrate 403. The cladding layer 402 may cover at least a portion of the core 401. The core 401 and the cladding layer 402 may include polymer and silica materials. A thermo-optic coefficient of polymer and silica may be about $-9.9\times10^{-4}$/K to about $-0.5\times10^{-4}$/K. A refractive index of the core 401 should be higher than that of the cladding layer 402. The core 401 or the cladding layer 402 may include a Bragg grating 410. The Bragg grating 410 may be formed through a dry or wet etching method and may reflect a specific wavelength. If the core 401 is formed of a polymer material, its thermo-optic coefficient may be higher than silica, and its refractive index may change in proportional to waveguide temperature change multiplied by a thermo-optic coefficient. A change of the refractive index of the core 401 may cause a change of a reflected wavelength of Bragg grating.

For example, when a thermo-optic coefficient of the core 401 is about $-3\times10^{-4}$/K and its refractive index is about 1.4, a wavelength may change in a range of about 1530 nm to about 1565 nm through a temperature change of about 105 K. In order to adjust a temperature of the core 401, a thin film heater 404 of a metal material is deposited and a current is applied to the thin film heater 404. In more detail, when a current is applied to the thin film heater 404, a temperature of the core 401 is increased and a refractive index of the core 401 is decreased by thermo-optic effects and also an effective period of the Bragg grating 410 becomes shortened, such that an output optical wavelength of the external cavity laser is changed toward a short wavelength. A center wavelength of a reflection band of the Bragg grating 410 is adjusted more than about 30 nm by the thin film heater 404. Thereby, a center wavelength of a laser beam that the wavelength-tunable external cavity laser module oscillates may be adjusted more than about 30 nm. Moreover, in order for stabilization of a specific wavelength, a phase control unit 406 is deposited jointly with the thin film heater 404, such that a change of a phase may be finely adjusted by a temperature change caused by current injection and a change of a refractive index according thereto. The Bragg grating 410 may be periodically engraved in the core 401 or the cladding 402. The order of Bragg grating 410 may be 1, 3, 5, or 7.

Figure 6A:
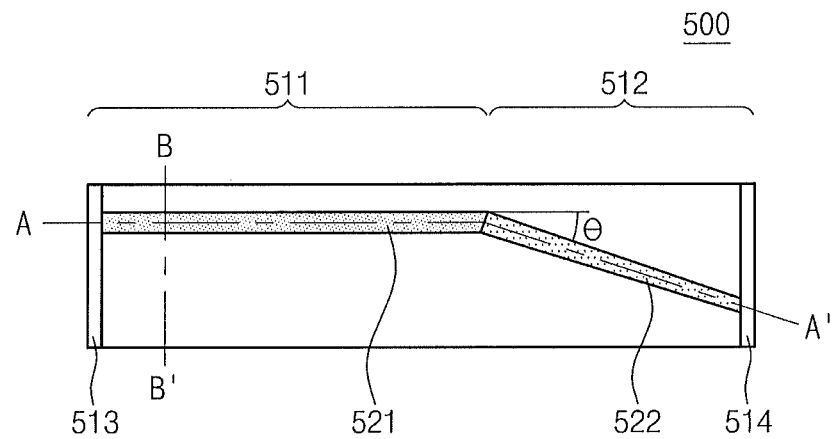
FIGS. 6A through 6D are views illustrating a detailed gain medium of a wavelength-tunable external cavity laser module according to an embodiment of the present invention.
Figure 6B:
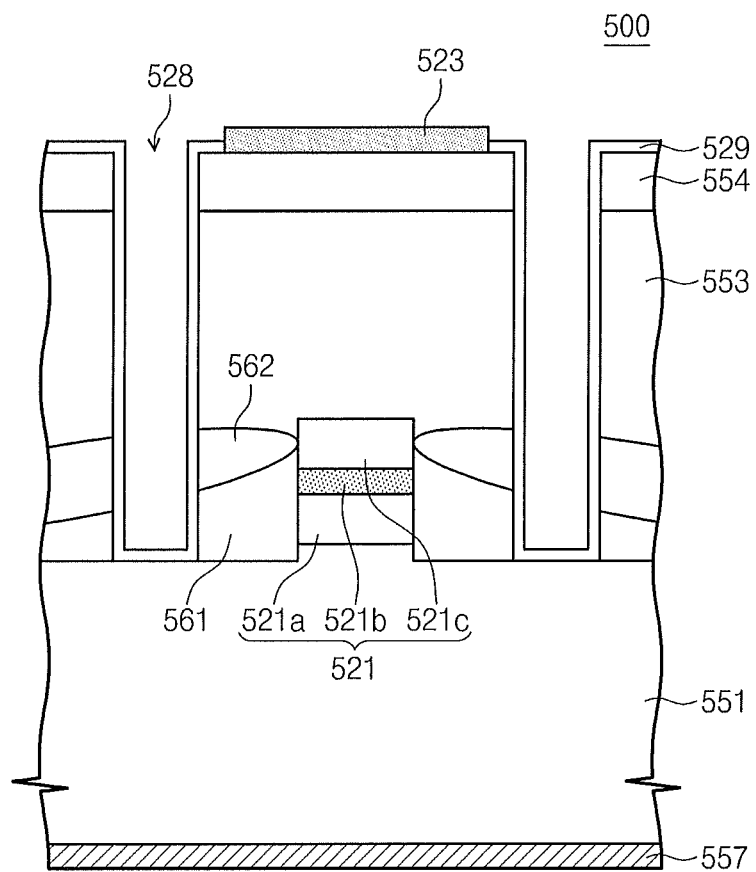
Figure 6C:
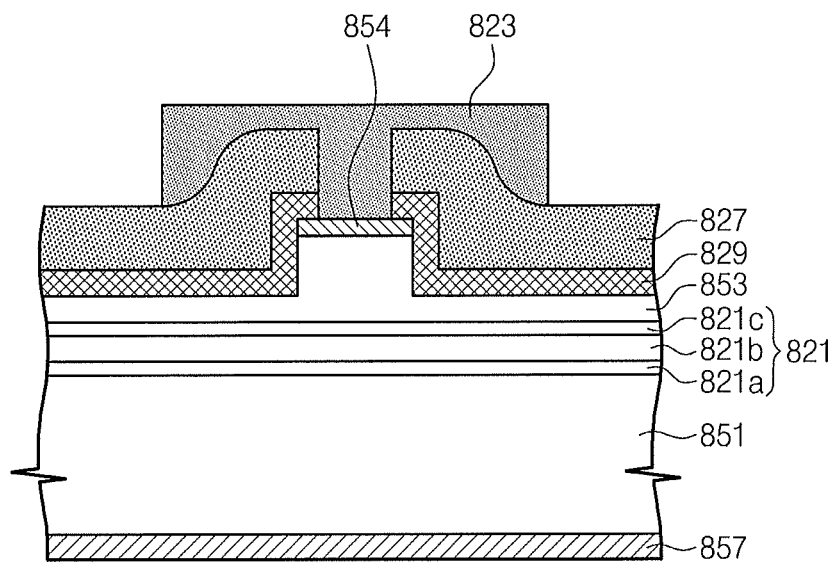
Figure 6D:
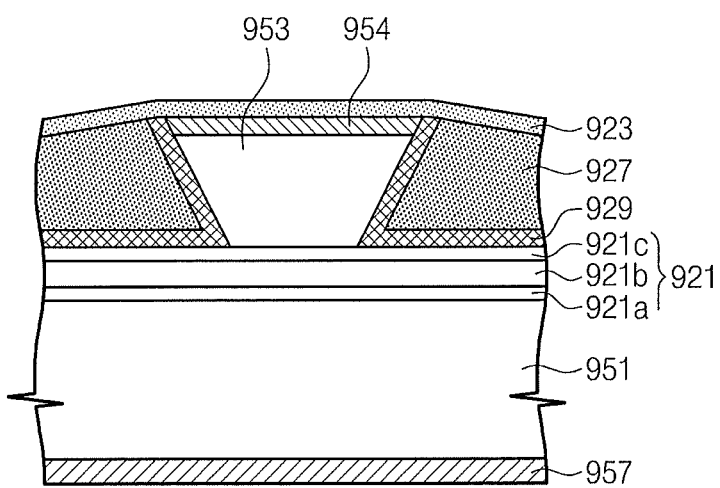

FIGS. 6A through 6D are views illustrating a detailed gain medium 500 of a wavelength-tunable external cavity laser module according to an embodiment of the present invention. FIGS. 6B, 6C, and 6D are sectional views taken along the line B-B' of FIG. 6A and illustrate respectively active waveguides of different forms.

The gain medium 500 may be a typical optical amplifier, a RSOA or a laser diode. Hereinafter, a case that the gain medium 500 is the RSOA will be described.

Referring to FIG. 6A, the gain medium 500 may include a passive waveguide region 512 and an active waveguide region 511. The active waveguide 521 may obtain a gain by current injection and the passive waveguide 522 may serve as a waveguide without gain. A light path is formed between HR-coated facet on gain medium 500 through the line A-A' and external mirror of optical waveguide 400. First, the light generated in active medium 511 is delivered through line A-A', then, input to the optical waveguide 400. The reflected light from optical waveguide 400 of external mirror is fed back into gain medium 500 and get some gain. The HR-coated mirror on the other facet acts as a pair mirror to form a laser cavity. A lasing light generated by internally repeating these processes is partially output to the external and then is used as a signal.

An internal reflection which occurs at AR-coated facet has a detrimental influence on a laser performance, so, the passive waveguide 522 tilted at a predetermined angle θ of about 5° to about 30° with respect to surface normal may be included to lower reflection further. In this case, according to Snell's law, the light that is directly reflected through a AR-coated facet mostly remains at the external of the waveguide. The passive waveguide 522 may include a spot size converter (SSC) for increasing optical coupling efficiency, with a similar shape to an optical mode of an optical fiber. In the SSC, a spot size is changed by tapering or increasing the width of an end of the passive waveguide 522. In a case of the direct optical coupling between the gain medium 500 and the optical waveguide 400, it is difficult to obtain a high optical coupling efficiency compared to when a lens is used because of a difference of spot sizes or shapes between two waveguide components. However, by integrating the SSC, optical coupling efficiency may be enhanced further.

In order for a laser of an external cavity structure to operate in a high speed of more than about 10 Gbps, an operating speed of the gain medium 500 should have a value of more than about 10 Gbps. For example, when a Fabri-Perot Laser Diode (FPLD) is fabricated using the gain medium 500, its operating speed should have an operating performance of about 10 Gbps at least within a range of current used Along with short optical cavity design, high speed active medium makes the ECL operate at high speed. A laser structure in which the high frequency operation is possible may include lasers with structures of a shallow ridge, a deep ridge, a buried ridge, a Fe-doped, and a entrenched.

Referring to a trench 528 of 6B, an active waveguide region 511 includes a p-type electrode 523 and an n-type electrode 557 to which current is injected, an active waveguide 521, an upper cladding layer 553 and a lower cladding layer 551, and an ohmic layer 554 for reducing a resistance between the upper cladding layer 553 and the p-type electrode 523. At both sides of the active waveguide 521, a buried heterostructure having a current blocking layer of a p-InP/n-InP/p-InP 561/562/553 may be disposed. The buried heterostructure has a limited operation in a high frequency region due to a large parasitic capacitance. Accordingly, as shown in FIG. 6B, the trench 528 is formed close to the active waveguide 521 and a dielectric thin film 529 covering the trench 528 is formed to reduce parasitic capacitance.

The active waveguide 521 includes a gain medium layer 521b. The active waveguide 521 may further include upper and lower separate confinement heterostructure layers (SCH) 521c and 521a for effectively confining gain materials (such as a bulk, a quantum well, quantum wire, and quantum dot) and light. The upper cladding layer 553 may be formed of p-InP and the lower cladding layer 551 may be formed of n-InP and the upper ohmic layer 554 may be formed of p+-InGaAs. A lower ohmic layer (not shown) may be formed of n+InGaAs. Here, p+ and n+ may typically mean doping level is more than about $1 \times 10^{18}/cm^3$.

Referring to FIG. 6C, compared to FIG. 6B, structure except for the current blocking layer is almost similar and the only difference is that a ridge is formed instead of current blocking layers. The structure shown in FIG. 6C may be classified as a shallow ridge. The repeated technical contents described with reference to FIG. 6B will be omitted for concise description. An n-type electrode 857, a lower cladding layer 851 on the n-type electrode 857, an active waveguide 821 on the lower cladding layer 851, an upper cladding layer 853 on the active waveguide 821, an ohmic layer 854 on the upper cladding layer 853, and a p-type electrode 823 on the ohmic layer are disposed. The active waveguide 821 may include a gain medium layer 821b and upper and lower SCH layers 821c and 821a. The upper ohmic layer 854 is formed between the upper cladding layer 853 and the p-type electrode 823, and a dielectric layer 829 and a polyimide layer 827 are disposed between the upper cladding layer 853 and the p-type electrode 823.

Referring to FIG. 6D, compared to FIG. 6B, structure except for the current blocking layer is almost similar and the only difference is that a ridge is formed instead of current blocking layers. The structure shown in FIG. 6D may be classified as a deep ridge. The repeated technical contents described with reference to FIG. 6B will be omitted for concise description.

An n-type electrode 957, a lower cladding layer 951 on the n-type electrode 957, an active waveguide 921 on the lower cladding layer 951, an upper cladding layer 953 on the active waveguide 921, and a p-type electrode 923 on the upper cladding layer 953 are formed. The active waveguide 921 may include a gain medium layer 921b, and upper and lower SCH layers 921c and 921a. A silicon oxide layer or a silicon nitride layer 929 may be formed along the both sides of the upper cladding layer 953 and the top surface of the active waveguide 921. A polyimide layer 927 may be formed between the p-type electrode 923 and the active waveguide 921, covering the silicon oxide layer or the silicon nitride layer 929.

Figure 7A:
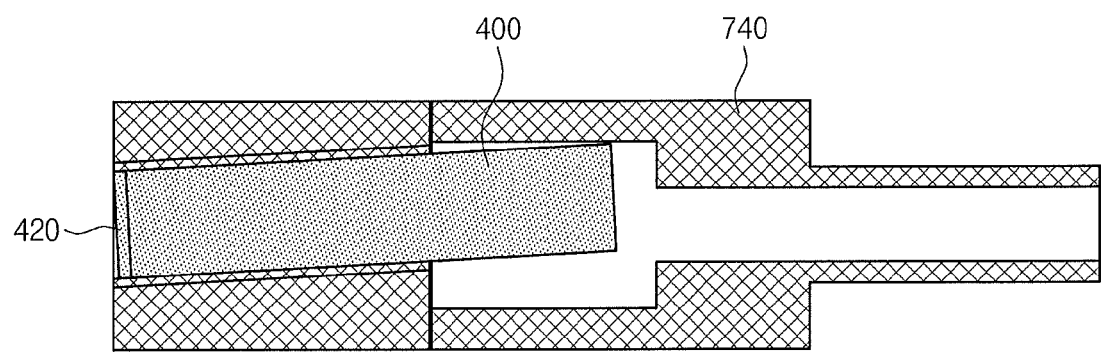
FIGS. 7A through 7C are views illustrating an optical waveguide and an optical waveguide supporting part when an additional waveguide supporting part according to an embodiment of the present invention is used.
Figure 7B:
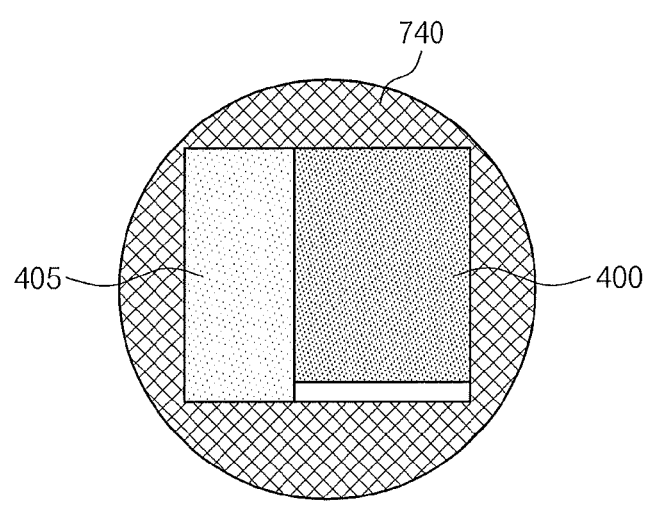
Figure 7C:
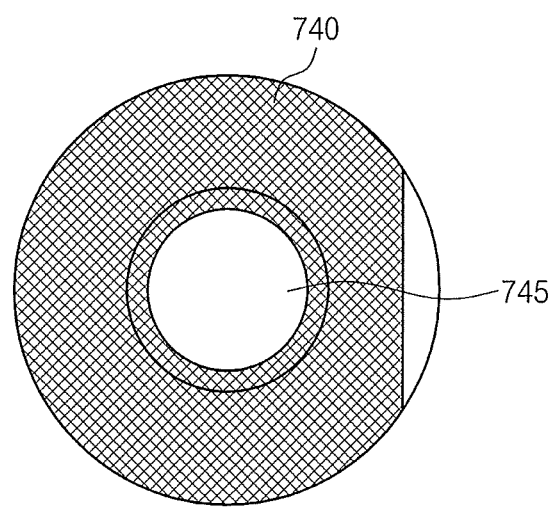

FIGS. 7A through 7C are views illustrating an optical waveguide 400 and an optical waveguide supporting part 740 when an additional waveguide supporting part according to an embodiment of the present invention is used. FIG. 7A is a top plan view of a portion where the optical waveguide 400 and the optical waveguide supporting part 740 are combined. FIG. 7B is a left side view of FIG. 7A and FIG. 7C is a right side view of FIG. 7A.

Referring to FIGS. 7A through 7C, the optical waveguide 400 may be fixed at the optical waveguide supporting part 740 being slant in a horizontal direction. This is because the incidence plane is etched at a predetermined angle to minimize a case that light is directly reflected back to the gain medium 500 on the incidence plane. Thus, this compensates propagation angle of an input/output light by Snell's law. This is similar to a principle of bending the passive waveguide of the gain medium 500. That is, unwanted reflection from the incident plane of the optical waveguide 400 is prevented such that a laser characteristic of the external cavity structure is not deteriorated. In addition, the optical waveguide 400 may further include a AR-coated layer 420 disposed at the incident plane. Only with the AR-coated layer 420, the surface of the optical waveguide 400 may have a reflectivity of less an about 1%. The above mentioned first thermoelectric cooler 405 may be disposed at the bottom of the optical waveguide 400. A temperature sensor (not shown) for monitoring a temperature of the optical waveguide 400 may be further disposed adjacent to the optical waveguide 400. The optical waveguide supporting part 740 may include a hole 745 through which an optical fiber (not shown) for extracting an input/output light of the optical waveguide 400 may be disposed.

Figure 8A:
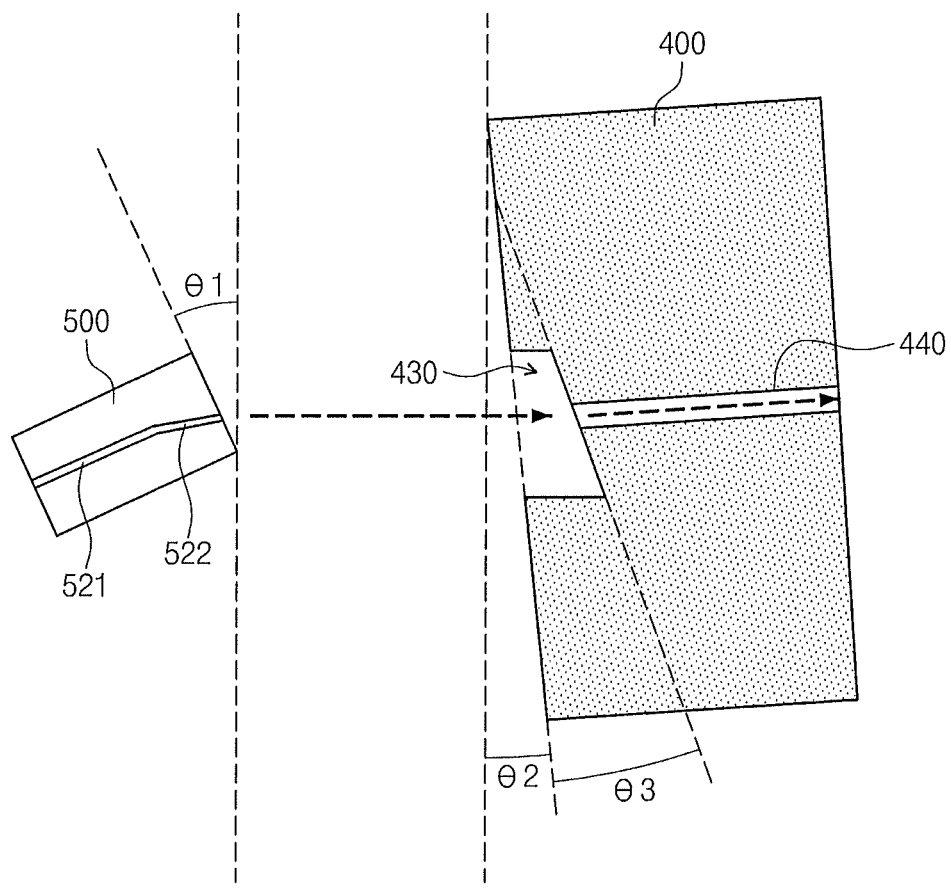
FIG. 8A is a view illustrating a coupling method of the light between a gain medium to an optical waveguide according to an embodiment of the present invention.
Figure 8B:
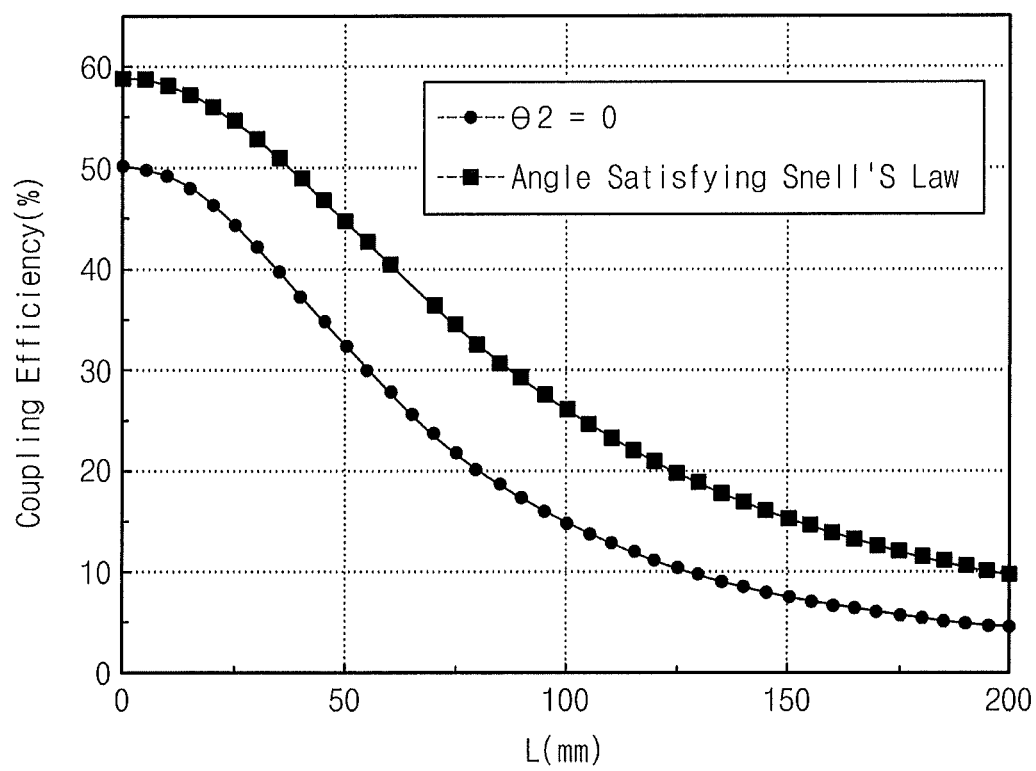
FIG. 8B is a computer simulation graph illustrating coupling efficiency of light according to an embodiment of the present invention.
Figure 9B:
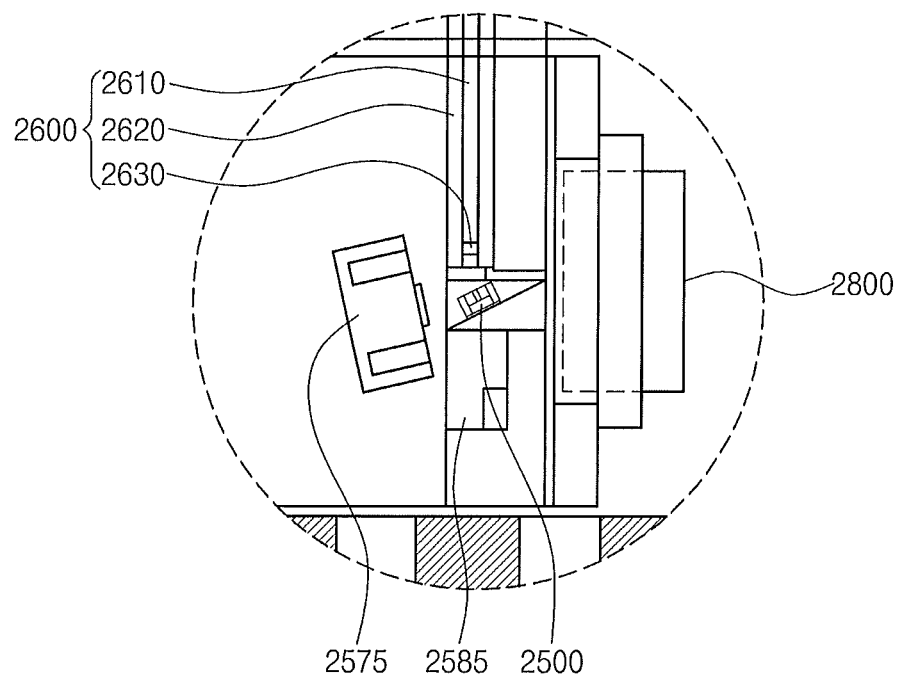
FIG. 9B is an enlarged portion C of FIG. 9A.

FIG. 8A is a view illustrating a coupling method of the light between a gain medium 500 to an optical waveguide 400 according to an embodiment of the present invention. FIG. 8B is a computer simulation graph illustrating coupling efficiency of light according to an embodiment of the present invention.

Referring to FIG. 8A, the gain medium 500 includes an active waveguide 521 and a passive waveguide 522. As mentioned above, the passive waveguide 522 may be slant at a predetermined angle with respect to the active waveguide 521 in order to reduce the coupling of direct back-reflection from the surface of optical waveguide. The output light according thereto is not perpendicular to the output plane and is diagonally output at a predetermined angle within a range satisfying Snell's law. In order for the light to be properly incident to the optical waveguide 400, the angle of fixing position of gain medium 500 is compensated to be diagonally disposed by an angle θ1.

In addition, as mentioned above, the optical waveguide 400 is fixed at the optical waveguide supporting part 740 with a predetermined angle θ2. This is because an incident plane of the optical waveguide 400 is cut at a predetermined angle or a groove 430 is formed in the incident plane to minimize a direct back-reflection. Thus, the surface of a waveguide 440 has an angle θ3 with respect to a normal line of the waveguide such that the reflected light cannot directly enter into the gain medium 500. The gain medium 500 may be assembled around the groove 430.

Referring to FIG. 8B, it illustrates coupling efficiencies when the angle θ2 described with FIG. 8A has an angle value satisfying Snell's law and the angle θ2 is 0. In a horizontal axis, L represents a distance between a gain medium and an optical waveguide. If the angle θ2 is an angle value satisfying Snell's law, it is confirmed that coupling efficiency of light is much higher. In more detail, compared to when the angle θ2 is 0, it is confirmed that coupling efficiency is higher by about 10%. If a waveguide on the optical waveguide 400 has a similar structure of a waveguide on a gain medium with angle satisfying Snell's law, an gain medium and an optical waveguide may be disposed facing each other horizontally and limitations on accessible distance by the slant of a structure may be resolved, such that the distance between the gain medium and the optical waveguide may be minimized.

A wavelength-tunable external cavity laser module according to an embodiment of the present invention may maintain a specific temperature regardless of a temperature change of an external environment by using the first thermoelectric cooler 405 and may tune a wavelength by using the thin film heater 404. Simultaneously, a high frequency operation may be possible by applying high frequency signal through the high frequency transmission medium 600.

Referring to FIGS. 9A through 10B, the wavelength-tunable external cavity laser module 2000 includes a gain medium 2500 for generating and amplifying light, an optical waveguide 2400 for forming a mirror surface by optically coupled with a gain medium 2500, and a high frequency transmission medium 2600 for delivering a high frequency signal to the gain medium 2500. The high frequency transmission medium 2600 may control an operating speed of the generated light. In more detail, once a bias current is applied to the gain medium 2500, a light is generated and amplified, and when this bias current becomes more than a critical value, lasing occurs between the mirror surface formed by the gain medium 2500 and the optical waveguide 2400. A high frequency signal delivered by the high frequency transmission medium 2600 is added to the bias current, such that a size of optical power generated in a laser is adjusted. An output power of the light may be modulated by a frequency of the high frequency signal. Modulation speed of the light signal may be understood as the degree (bit per second) that a digital signal or an analog signal repeats. In more detail, when a current or voltage value of a high frequency signal delivered by the high frequency transmission medium 600 is controlled, it may be modulated into a digital signal in which a relatively high optical power is defined as 1 and a relatively low optical power is defined as 0. This digital signal may have a bit rate of more than about 10 Gbps.

The high frequency transmission medium 2600 may be a PCB or a submount. The PCB or submount may include a conductive metal thin wring 2610, a dielectric 2620, and a matching resistance unit 2630. If the high frequency transmission medium 2600 is the PCB, the dielectric 2620 may include an epoxy resin or a phenolic resin. If the high frequency transmission medium 2600 is the submount, the dielectric 2620 may include a ceramic dielectric. The matching resistance unit 2630, being added with a resistance value of the gain medium 2500, may function to adjust total impedance of signal transmission point, such that signal transmission to the device is maximized. The matching resistance unit 2630 adjusts a total impedance including the gain medium 2500 to be about 25Ω, about 50Ω, or about 75Ω according to an internal impedance of a signal source. The metal thin line 2610 on the high frequency transmission medium 2600 may include a microstrip line or a CPW and may be combined with the dielectric 2620 to form a transmission line.

The gain medium 2500, the optical waveguide 2400, and the high frequency transmission medium 2600 may be all mounted on a package 2710. The package 2710 may have a form of a buffer fly, a mini DIL, a mini flat, a TOSA, and a transistor outline (TO) can. The package 2710 may include a lead frame 2705 for delivering an external electrical signal. The high frequency transmission medium 2600 may transmit a high frequency electrical signal, which is delivered through a high frequency connector 2730, to the gain medium 2500.

The optical waveguide 2400 may be combined with the package 2710 through an additional optical waveguide supporting part 2740. In this case, one of the gain medium 2500 or the optical waveguide 2400 may be fixed to the package 2710 in advance and then, the other may be combined through a laser welding method, an active alignment using the metal support structure for welding 2720.

A first thermoelectric cooler 2405 may be disposed at the bottom of the optical waveguide 2400. The first thermoelectric cooler 2405 may adjust a temperature of the optical waveguide 2400 to be a specific temperature. The gain medium 2500 may be disposed on the top of an additional second thermoelectric cooler 2570. The additional second thermoelectric cooler 2570 may adjust a temperature of the gain medium 2500 to be a specific temperature. A structure supporting part 2590 may be disposed between the second thermoelectric cooler 2570 and the gain medium 2500. The structure supporting part 2590 may include a silicon or compound semiconductor substrate with a pattern for a device alignment or a SUS with excellent processability. A thermistor or 2585 for measuring a temperature of the gain medium 2500 may be disposed on the structure supporting part 2590. An optical detector 2575 for monitoring an optical power of the gain medium 2500 may be disposed on the structure supporting part 2590. The optical detector 2575 may include a photo diode.

The metal support structure for welding 2720 may form a thermal emission path of the optical waveguide 2400 and the thermal emission path may be formed by applying a solder or an epoxy of a silver component to a junction part when a package is assembled.

Unlike an embodiment of the present invention, a lens 2800 may be disposed between the gain medium 2500 and the optical waveguide 2400. The lens 2800 may couple the light between the gain medium 2500 and the optical waveguide 2400. That is, by the usage of lens 2800, the size and shape of the light from the gain medium are adjusted such that optical coupling efficiency may be improved. At both sides of the lens 2800, a AR-coating layer (not shown) is applied such that optical coupling efficiency may be further improved. The lens 2800 may be mounted in the package 2710 along with the gain medium 2500 and the optical waveguide 2400.

Figure 10A:
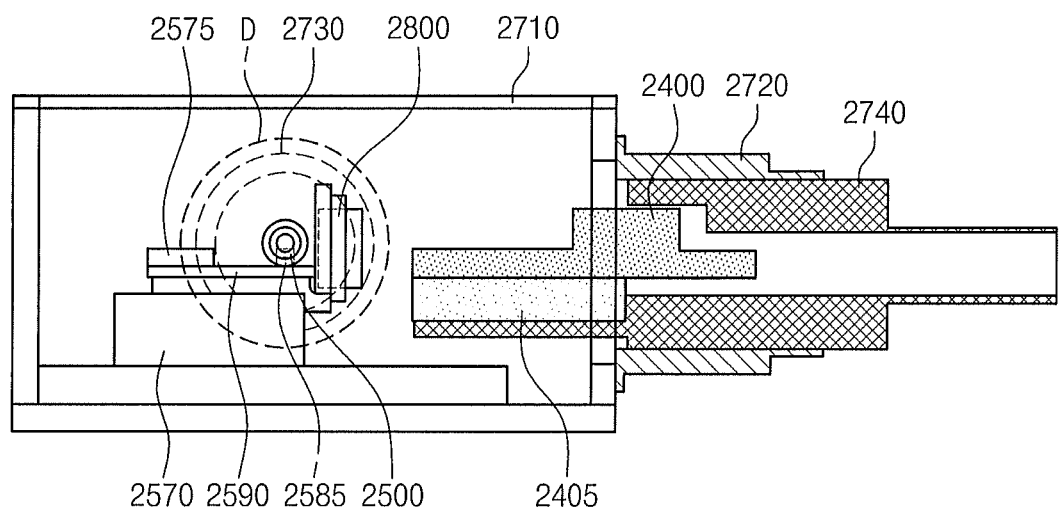
FIG. 10A is a sectional view taken along the line II-II' of FIG. 9A.
Figure 10B:
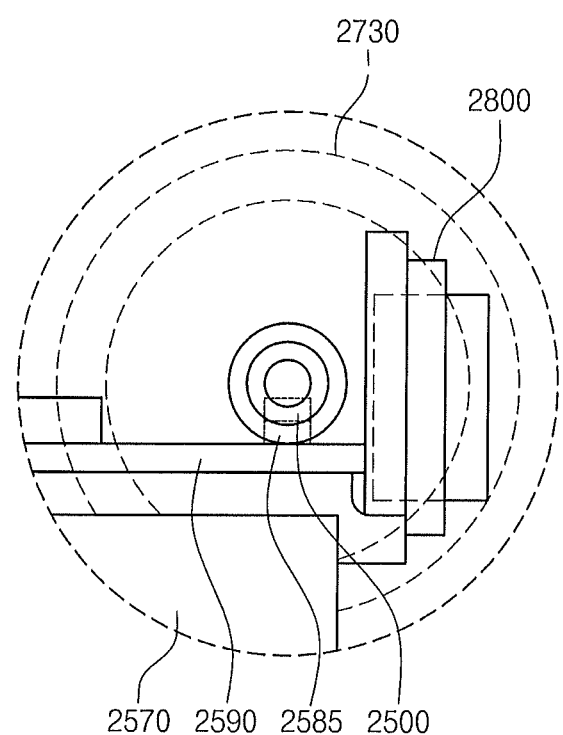
FIG. 10B is an enlarged portion D of FIG. 10A.
Figure 10C:
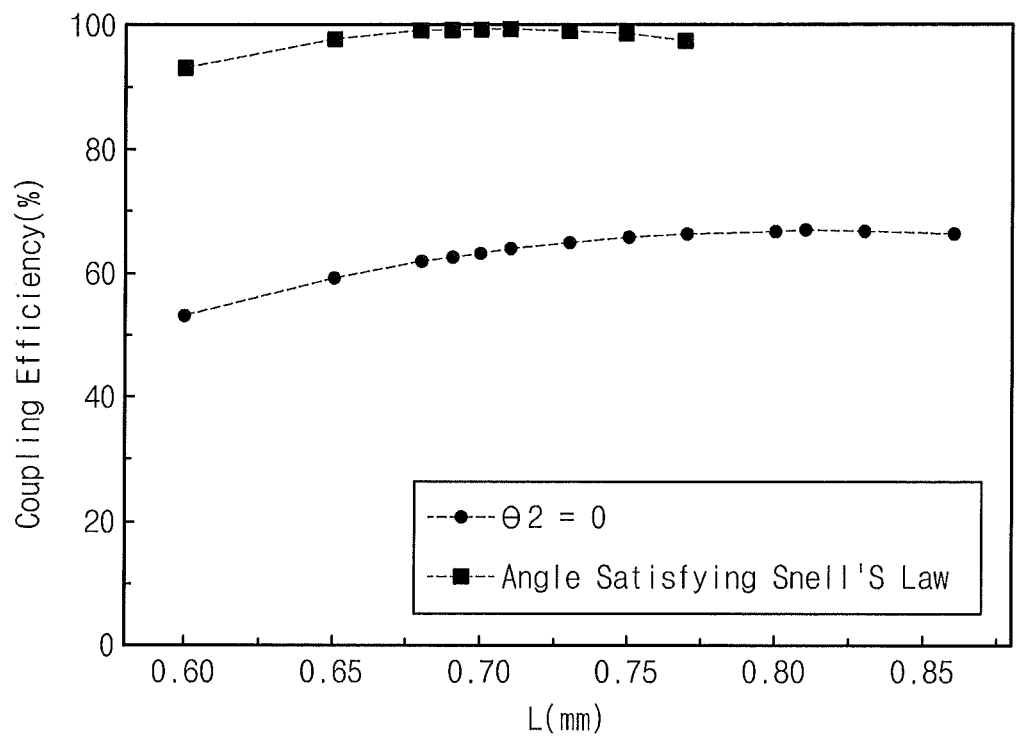
FIG. 10C is a computer simulation graph illustrating coupling efficiency of light according to an embodiment of the present invention.

Referring to FIG. 10C, it illustrates coupling efficiencies using lens when the angle θ2 is 0 and the angle θ2 described with FIG. 8A has an angle value satisfying Snell's law. In a horizontal axis, L represents a distance between a gain medium and an optical waveguide. If the angle θ2 is an angle value satisfying Snell's law, it is confirmed that coupling efficiency of light is much higher. In more detail, compared to when the angle θ2 is 0, coupling efficiency of about ⅔ level is obtained. Compared to the maximum optical coupling efficiency, coupling efficiency of almost 100% may be theoretically achieved, such that coupling efficiency improvement, is provided. Therefore, it is advantageous to a static laser characteristic such as output optical power. However, due to the usage of lens, the total cavity length is increased such that a cavity peak easily occurs within a frequency range to be used, thereby reducing a bandwidth.

Figure 11:
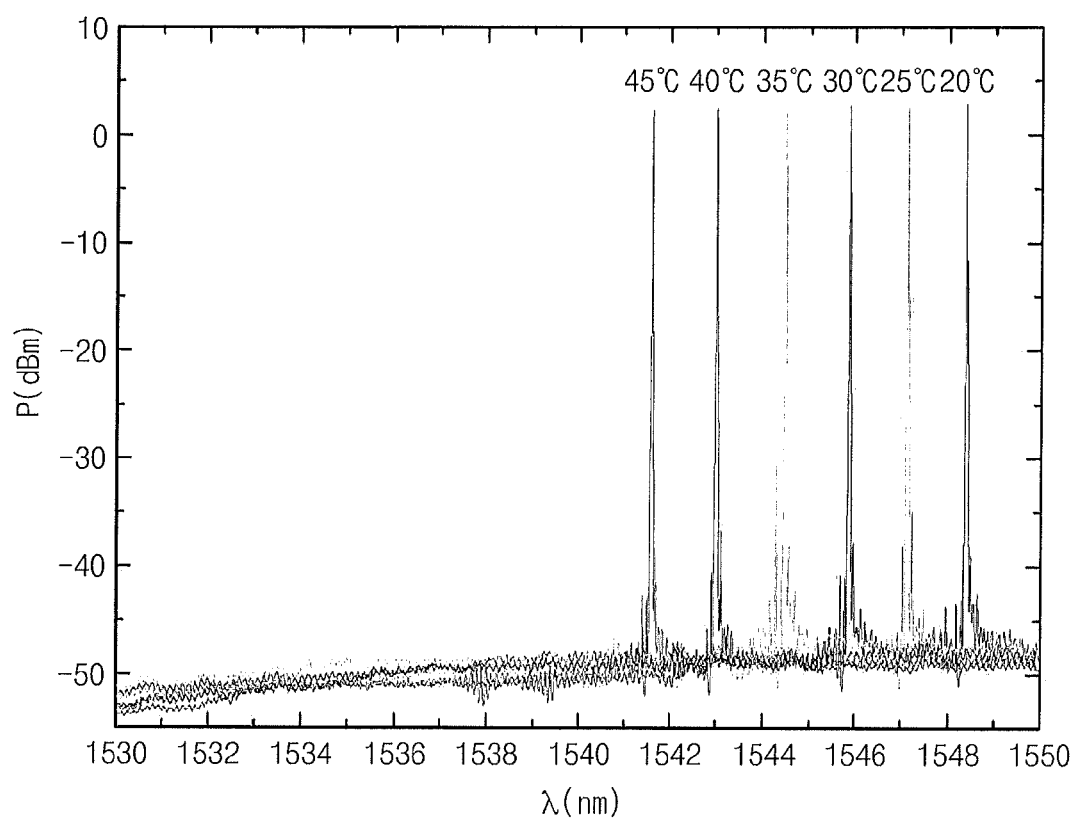
FIG. 11 is a graph illustrating a wavelength tuning characteristic according to a temperature of an optical waveguide according to an embodiment of the present invention.

FIG. 11 is a graph illustrating a wavelength tuning characteristic as a function of a temperature of an optical waveguide according to an embodiment of the present invention.

In FIG. 11, a horizontal axis represents a wavelength λ and a vertical axis represents an optical power P (dBm). Also, it shows that a wavelength changes according to a temperature of the optical waveguide 400. A single mode characteristic is well shown when a side mode suppression ratio (SMSR) is more than about 30 dB. In more detail, after a temperature of the optical waveguide 400 is fixed with a specific temperature by using the first thermoelectric cooler 405, a wavelength may be tuned by operating the thin film heater 404 to adjust a temperature of a grating part of the optical waveguide.

Figure 12A:
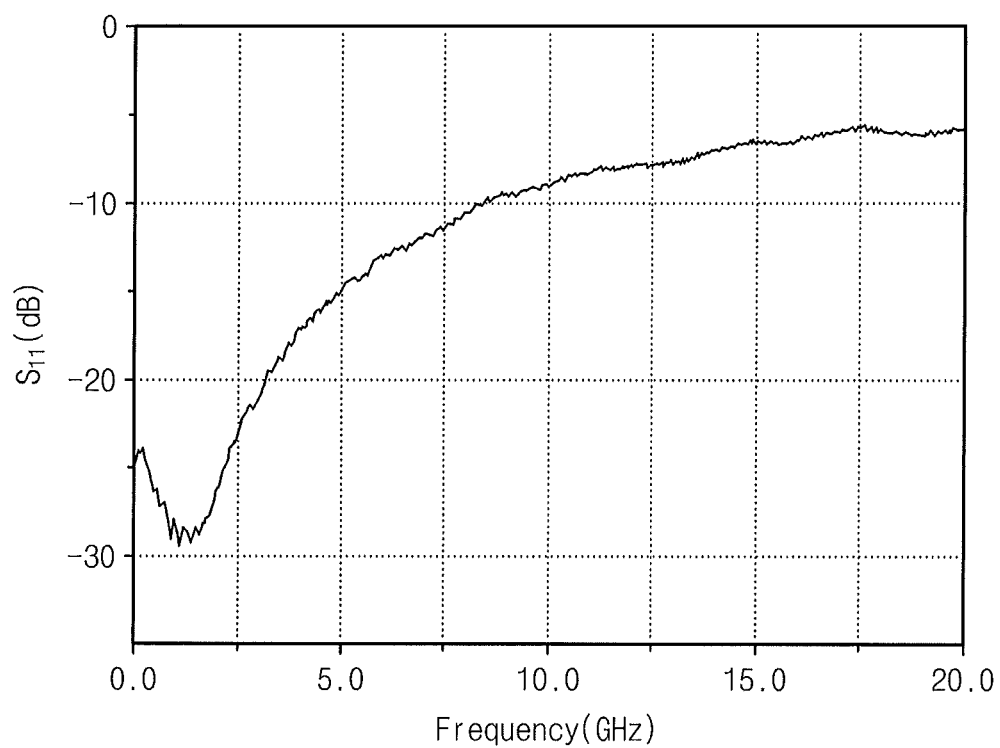
FIGS. 12A and 12B are graphs illustrating a delivery characteristic of a high frequency signal according to an embodiment of the present invention.
Figure 12B:
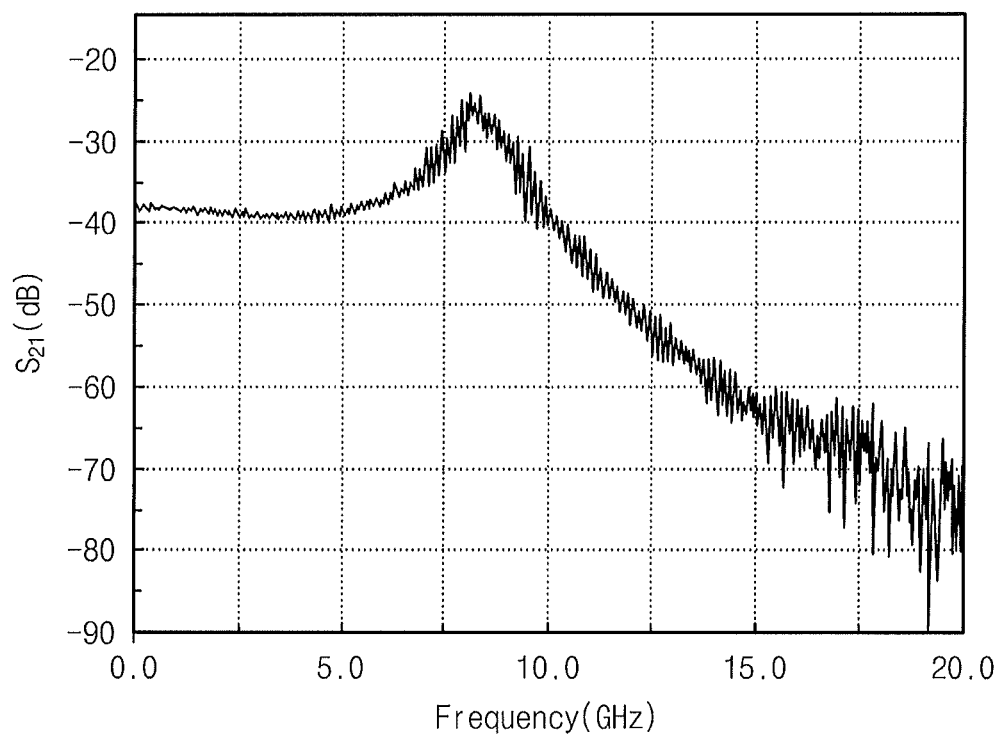

FIGS. 12A and 12B are graphs illustrating a high frequency characteristic of a ECL according to an embodiment of the present invention.

In FIG. 12A, a vertical axis represents a reflection coefficient $S_{11}$ and a horizontal axis represents a frequency (GHz). Based on the reflection coefficient of about −10 dB, it is apparent that a high frequency signal is well delivered to a laser up to about 10 GHz and it is possible that a frequency characteristic of more than about 10 GHz may be achieved through adjustment such as matching circuit.

In FIG. 12B, a vertical axis represents an operating bandwidth $S_{21}$ of a laser and a horizontal axis represent a frequency (GHz). It is apparent that a high speed operation of more than about 10 Gbps is possible with a −3 dB bandwidth of about 10 GHz.

According to embodiments of the present invention, a wavelength-tunable external cavity laser module includes a high frequency transmission medium for delivering a high frequency signal to a gain medium. The high frequency transmission medium may transmit the signal without distortion to the gain medium. Accordingly, the wavelength-tunable external cavity module according to embodiments of the present invention may provide a high speed operation.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A wavelength-tunable external cavity laser module comprising:
    a gain medium to which a bias current is applied;
    an optical waveguide combined with the gain medium and including a Bragg grating and a thin film heater adjusting a temperature of the Bragg grating;
    a high frequency transmission medium delivering a high frequency signal to the gain medium; and
    a package in which the gain medium and the optical waveguide are mounted,
    wherein the gain medium and the optical waveguide are directly combined with each other,
    wherein the high frequency transmission medium is disposed such that the high frequency signal delivered by the high frequency transmission medium is added to the bias current,
    the gain medium generates light corresponding to the bias current to which the high frequency signal has been added, and
    the high frequency transmission medium controls an operating speed of the light,
    wherein:
    a current value of the high frequency signal is controlled to modulate the optical power of the light into a digital signal;
    a frequency of the high frequency signal is set to let the digital signal have a bit rate of 10 Giga bit per second or greater;
    the high frequency transmission medium comprises a transmission line and a matching resistance unit, the matching resistance unit being disposed between the transmission line and the gain medium; and
    both of the transmission line and the matching resistance unit are disposed within the package.

2. The wavelength-tunable external cavity laser module of claim 1, wherein the high frequency transmission medium comprises a submount including the transmission line, and the transmission line is formed by a ceramic dielectric and a metal thin line on the ceramic dielectric.

3. The wavelength-tunable external cavity laser module of claim 1, wherein the high frequency transmission medium comprises a printed circuit board (PCB).

4. The wavelength-tunable external cavity laser module of claim 1, wherein the gain medium comprises a semiconductor optical amplifier or a laser diode.

5. The wavelength-tunable external cavity laser module of claim 1, further comprising a lens disposed between the gain medium and the optical waveguide, wherein the lens delivers the light between the gain medium and the optical waveguide.

6. The wavelength-tunable external cavity laser module of claim 1, wherein the optical waveguide further comprises:
    a cladding layer on a substrate; and
    a core layer having at least a portion coated by the cladding layer,
    wherein the Bragg grating is disposed on the core layer or the cladding layer; and the thin film heater is disposed on the cladding layer.

7. The wavelength-tunable external cavity laser module of claim 6, wherein the optical waveguide further comprises a phase control unit disposed on the cladding layer.

8. The wavelength-tunable external cavity laser module of claim 6, wherein the optical waveguide further comprises an anti-reflection (AR)-coated layer disposed on an incident plane.

9. The wavelength-tunable external cavity laser module of claim 6, wherein an incident plane of the optical waveguide is slant with respect to a vertical plane in a progressing direction of the light.

10. The wavelength-tunable external cavity laser module of claim 6, wherein the core layer and the cladding layer comprise polymer.

11. The wavelength-tunable external cavity laser module of claim 6, wherein the core layer and the cladding layer comprise silica.

12. The wavelength-tunable external cavity laser module of claim 6, further comprising a first thermoelectric cooler disposed at the bottom of the optical waveguide.

13. The wavelength-tunable external cavity laser module of claim 1, further comprising:
    a second thermoelectric cooler adjusting a temperature of the gain medium; and a thermistor measuring a temperature of the gain medium.

14. The wavelength-tunable external cavity laser module of claim 1, further comprising an optical detector to monitor the light.

15. The wavelength-tunable external cavity laser module of claim 1, wherein the gain medium is disposed between the high frequency transmission medium and the optical waveguide.

16. The wavelength-tunable external cavity laser module of claim 1, wherein the gain medium has an active waveguide and a passive waveguide, and the passive waveguide is tilted with respect to a lengthwise direction of the active waveguide.

* * * * *